United States Patent
Tachibana

(10) Patent No.: US 6,597,182 B1
(45) Date of Patent: Jul. 22, 2003

(54) DETECTOR FOR DETECTING CONTACT RESISTANCE ANOMALY OF CATHODE ELECTRODE IN ELECTROPLATING MACHINE

(75) Inventor: Hiroaki Tachibana, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/562,899

(22) Filed: May 2, 2000

(30) Foreign Application Priority Data

May 7, 1999 (JP) ............................. 11-127276

(51) Int. Cl.[7] ...................... G01R 27/00; G01R 31/26; H01H 31/02
(52) U.S. Cl. ..................... 324/600; 324/537; 324/719
(58) Field of Search ................. 324/600, 602, 324/500, 557, 756, 757, 716, 719; 205/118, 122, 123, 133

(56) References Cited

U.S. PATENT DOCUMENTS

| | | | | |
|---|---|---|---|---|
| 4,120,759 A | * | 10/1978 | Asami et al. | ............. 324/439 |
| 4,682,199 A | * | 7/1987 | Yatsuo et al. | ............. 257/160 |
| 5,024,746 A | * | 6/1991 | Stierman et al. | ........... 204/287 |
| 5,273,642 A | * | 12/1993 | Crites et al. | ............. 205/122 |
| 6,103,085 A | * | 8/2000 | Woo et al. | ............... 205/122 |
| 6,241,869 B1 | * | 6/2001 | Maeda | ...................... 205/137 |
| 6,300,242 B1 | * | 10/2001 | Ueda et al. | ............. 438/638 |
| 6,426,255 B1 | * | 7/2002 | Asano et al. | ............ 438/253 |

FOREIGN PATENT DOCUMENTS

JP   56050523 A   *   5/1981   ......... H01L/21/58

* cited by examiner

Primary Examiner—Kamand Cuneo
Assistant Examiner—Jermele Hollington
(74) Attorney, Agent, or Firm—Young & Thompson

(57) ABSTRACT

In an electroplating machine having a number of cathode electrodes which are simultaneously brought into contact with a silicon wafer to be electroplated in a semiconductor device fabricating process, a detector for detecting a contact resistance anomaly in a number of cathode electrodes includes a testing wafer which is formed of a circular silicon wafer and which has a number of metal film strips formed on one surface of the circular silicon wafer, separately from each other, so that the number of cathode electrodes can be individually brought into contact with the number of metal film strips, respectively. When the cathode electrodes are individually brought into contact with the metal film strips, respectively, a measuring tool is used to measure a contact resistance between each of the number of cathode electrodes and a corresponding one of the number of metal film strips.

19 Claims, 3 Drawing Sheets

DETECTOR FOR DETECTING CONTACT RESISTANCE ANOMALY OF CATHODE ELECTRODE IN ELECTROPLATING MACHINE

BACKGROUND OF THE INVENTION

The present invention relates to an electroplating machine having a plurality of cathode electrodes which are simultaneously brought into contact with a matter to be electroplated, at a corresponding number of contact points, and more specifically to a detector for detecting a contact resistance anomaly in the plurality of cathode electrodes of the electroplating machine.

In a Cu damascene interconnection forming process in a semiconductor device fabricating line, before a CMP (chemical mechanical polishing) step after an electroplating step, a film thickness of a Cu plated film is preferred to be as uniform as possible along a concentric circle. For the purpose of meeting with this demand, it is the present tendency to increase the number of contact points, namely, the number of cathode electrodes provided in a Cu electroplating machine.

However, since an in-plane distribution of the Cu plated film thickness greatly depends upon a contact resistance between each of the cathode electrodes and a wafer to be electroplated. Namely, if the contact resistance varies, the Cu plated film thickness correspondingly greatly varies. As a result, with an increase in the number of cathode electrodes, it has become difficult to make the Cu plated film thickness uniform along a concentric circle.

In order to overcome the above mentioned problem, it is necessary to measure the contact resistance between each of the cathode electrodes and the wafer to be electroplated, and to adjust the cathode electrode presenting a high contact resistance so that the contact resistance of all the cathode electrodes becomes uniform.

In a conventional measuring method, however, a testing wafer is used which has a metal film coated on the whole surface of the testing wafer. Therefore, only one contact resistance between the testing wafer and all the cathode electrodes can be measured, and therefore, it is impossible to identify the cathode electrode presenting an inadequate or defective contact with the wafer.

Therefore, in the Cu electroplating machine having a number of cathode electrodes, there are now demanded a method and a device capable of identifying the cathode electrode presenting an inadequate or defective contact.

BRIEF SUMMARY OF THE INVENTION

Accordingly, in order to overcome the above mentioned problems of the prior art, it is an object of the present invention to provide a detector for detecting a cathode electrode presenting an inadequate or defective contact, in an electroplating machine having a plurality of cathode electrodes.

Another object of the present invention is to provide a means capable of individually measuring a contact resistance of each cathode electrode in an electroplating machine having a plurality of cathode electrodes, thereby to find out a cathode electrode presenting a contact resistance anomaly.

The above and other objects of the present invention are achieved in accordance with the present invention by a detector for detecting a contact resistance anomaly in a plurality of cathode electrodes provided in an electroplating machine which is so configured that the plurality of cathode electrodes are simultaneously brought into contact with a matter to be electroplated, the detector including a testing wafer having a plurality of metal films formed thereon separately from each other so that the plurality of cathode electrodes can be individually brought into contact with the plurality of metal films, respectively, and a measuring means for measuring a contact resistance between each of the plurality of cathode electrodes and a corresponding one of the plurality of metal films when the plurality of cathode electrodes are individually brought into contact with the plurality of metal films, respectively.

With the above mentioned arrangement, since the plurality of metal films are formed on the testing wafer, separately from each other, the plurality of cathode electrodes can be individually brought into contact with the plurality of metal films, respectively. Therefore, when the plurality of cathode electrodes are individually brought into contact with the plurality of metal films, respectively, the measuring means can measure a contact resistance between each of the plurality of cathode electrodes and a corresponding one of the plurality of metal films, without being influenced by a contact condition of the other cathode electrodes. Accordingly, it is possible to identify the cathode electrode showing an extremely high contact resistance, which can be deemed to be a cathode electrode presenting an inadequate or defective contact when the cathode electrode was actually brought into contact with a matter to be actually electroplated. Therefore, by adjusting the cathode electrode presenting an inadequate or defective contact, the contact resistance of all the cathode electrodes can be made uniform when the cathode electrodes are actually brought into contact with a matter to be electroplated in the electroplating machine, with the result that an in-plane distribution of the plated film thickness can be made uniform. Namely, it is possible to obtain the plated film having a film thickness uniform along a concentric circle.

In a preferred embodiment, each of the plurality of metal films includes a contact point to which a corresponding one of the plurality of cathode electrodes is brought into contact, and a measuring point to which one end of the measuring means is brought into contact, for measuring at the contact point the contact resistance of the corresponding one of the plurality of cathode electrodes.

In one embodiment, the testing wafer has at least one intervening film formed thereon, and the plurality of metal films are formed on the at least one intervening film. The at least one intervening film can be formed of a material selected from the group consisting of Ta, TaN, Ti and TiN. Each of the metal films can be formed of a single metal layer, or a plurality of laminated metal layers. Each of the metal films can be formed of a material selected from the group consisting of Cu, Al, AlCu and W.

Furthermore, the testing wafer can be formed of a silicon wafer.

The above and other objects, features and advantages of the present invention will be apparent from the following description of preferred embodiments of the invention with reference to the accompanying drawings.

DETAILED DESCRIPTION OF THE INVENTION

Figure 1:
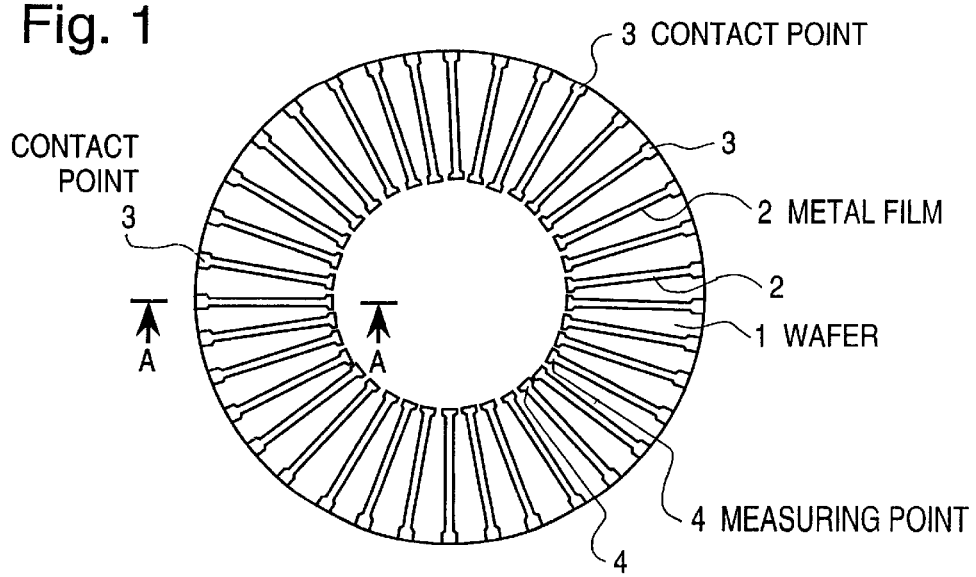
FIG. 1 is a diagrammatic plan view of a testing wafer used in a first embodiment of the detector in accordance with the present invention for individually detecting a contact resistance anomaly of each cathode electrode in an electroplating machine having a plurality of cathode electrodes.
Figure 2:
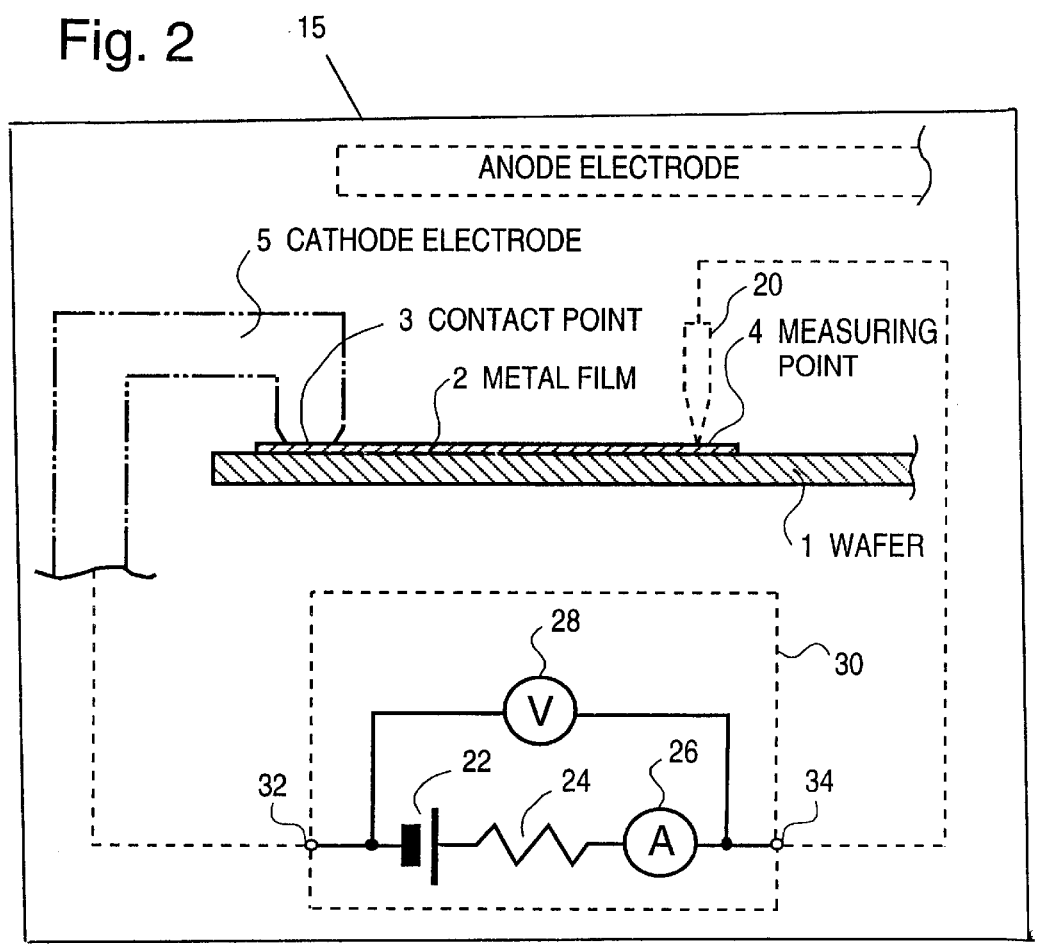
FIG. 2 is a diagrammatic sectional view taken along the line A—A in FIG. 1, and a circuit for illustrating a principle for individually measuring the contact resistance of each cathode electrode in the electroplating machine.

Referring to FIG. 1, there is shown a diagrammatic plan view of a testing wafer used in a first embodiment of the detector in accordance with the present invention for individually detecting a contact resistance anomaly of each cathode electrode in an electroplating machine 15 having a plurality of cathode electrodes. FIG. 2 is a diagrammatic sectional view taken along the line A—A in FIG. 1, and a circuit for illustrating a principle for individually measuring the contact resistance of each cathode electrode in the electroplating machine 15.

A testing wafer is prepared, which includes a number of metal film strips 2 which are formed on a surface of a circular silicon wafer 1, as shown in FIG. 1. In the shown embodiment, the number of metal film strips 2 are the same number as that of cathode electrodes (not shown in FIG. 1) of an electroplating machine. However, the number of metal film strips 2 can be larger than the number of the cathode electrodes but cannot be smaller than the number of the cathode electrodes.

As shown in FIG. 1, the metal film strips 2 are located with equal angular intervals, separately from each other. The metal film strips 2 extend radially inwardly from a peripheral edge of the circular silicon wafer 1 and have the same width, the same length, and the same plan shape. The length of the metal film strips 2 is shorter than a radius of the circular silicon wafer 1, so that the wafer 1 has a center region in which no metal film strip is provided, and therefore, the metal film strips 2 are never contacted with each other.

A contact point 3 is formed on a radially outward end of each metal film strip 2, and a measuring point 4 is formed on a radially inward end of each metal film strip 2, so that in a measuring operation, a cathode electrode 5 shown by a two-dot chain line in FIG. 2 is brought into contact with the contact point 3, as shown in FIG. 2, and a measuring probe 20 shown by a dotted line in FIG. 2 is brought into contact with the measuring point 4. For simplification, only one cathode electrode 5 is shown in FIG. 2, but it is to be understood that a number of cathode electrodes are provided in the electroplating machine. An anode electrode of the electroplating machine is conceptually shown by a dotted line in FIG. 2.

The measuring probe 20 is electrically connected to a plus terminal 34 of a measuring circuit 30, which includes, for example, a constant voltage DC source 22, a buffer resistor 24, and an ammeter 26 which are connected in series in the named order between a minus terminal 32 and the plus terminal 34, and a voltmeter 28 connected in parallel to a series circuit formed of the constant voltage DC source 22, the buffer resistor 24 and the ammeter 26. On the other hand, the minus terminal 32 of the measuring circuit 30 is electrically connected to all the cathode electrodes provided in the electroplating machines, since all the cathode electrodes provided in the electroplating machines are interconnected in the inside of the electroplating machines.

In a measurement, the testing wafer thus prepared above is located on a predetermined place in the electroplating machine where a wafer to be electroplated is located in the course of a semiconductor device fabricating process. At this measuring time, the electroplating machine is maintained in a dry condition in which no electrolyte exists. Here, it is assumed that each cathode electrode 5 has a known resistance value $R_1$, and each metal film strip 2 has a known resistance value $R_2$ between the contact point 3 and the measuring point 4. It is also assumed that a resistance between each cathode electrode 5 and the measuring circuit, a resistance between the measuring probe 20 and the measuring circuit, and a contact resistance between the measuring probe 20 and each metal film strip 2 are all negligible.

In this condition, the cathode electrodes provided in the electroplating machines are simultaneously brought into contact with the contact point 3 of the metal film strips 2, respectively, and the minus terminal 32 of the measuring circuit 30 is electrically connected to all the cathode electrodes (since all the cathode electrodes provided in the electroplating machines are interconnected in the inside of the electroplating machines). The measuring probe 20 is contacted to the measuring point 4 of all the metal film strips 2, one after another, while measuring a current flowing through the metal film strip 2 and a voltage drop between the plus terminal 34 and the minus terminal 32. From the measured current value and the measured voltage drop of the respective metal film strip 2, a resistance value $R_3$ of a series circuit formed of the resistance $R_1$ of the cathode electrode, a contact resistance $R_4$ between the cathode electrode and the contact point 3 of the metal film strip 2, and the resistance $R_2$ of the metal film strip 2, can be obtained individually for each of the cathode electrodes. Thus, the contact resistance $R_4$ between the cathode electrode and the contact point 3 of each metal film strip 2 can be obtained from $\{R_3-(R_1+R_2)\}$.

Accordingly, the individual contact resistance $R_4$ of all the cathode electrodes 5 can be known, although all the cathode electrodes provided in the electroplating machines are interconnected in the inside of the electroplating machines. The cathode electrode 5 showing an extremely high contact resistance can be deemed to be a cathode electrode presenting an inadequate or defective contact. Therefore, by adjusting the cathode electrode showing the high contact resistance, the contact resistance of all the cathode electrodes can be made uniform, when the cathode electrodes are actually brought into contact with a wafer to be electroplated in the electroplating machine, with the result that an in-plane distribution of the thickness of the plated film actually formed on the wafer can be made uniform. Namely, it is possible to obtain the plated film having a film thickness uniform along a concentric circle.

In the above mentioned measurement, if the resistance value $R_1$ of each cathode electrode 5 is not known, it is previously measured before the measurement of $R_3$. In addition, if the resistance value $R_2$ of each metal film strip 2 is not known, it is previously measured before the testing wafer is set in the electroplating machine. If the resistance between each cathode electrode 5 and the measuring circuit and the resistance between the measuring probe 20 and the measuring circuit are not negligible, these resistance are previously measured as $R_5$ and $R_6$, so that the contact resistance $R_4$ between the cathode electrode and the contact point 3 can be obtained from $\{R_3-(R_1+R_2+R_5+R_6)\}$. On the other hand, the measuring probe 20 has a sharpened tip end so that the contact resistance between the measuring probe 20 and each metal film strip 2 is negligible.

Figure 3:
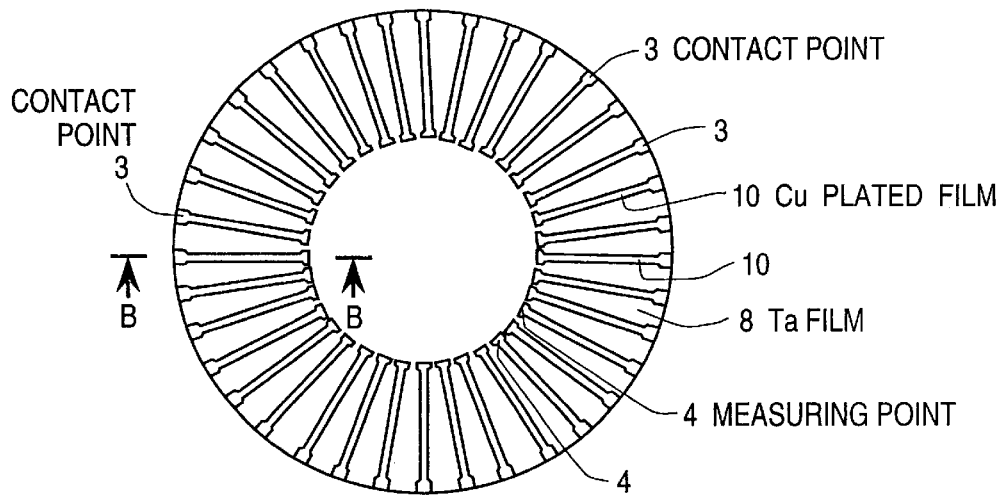
FIG. 3 is a diagrammatic plan view of a testing wafer used in a second embodiment of the detector in accordance with the present invention.
Figure 4:
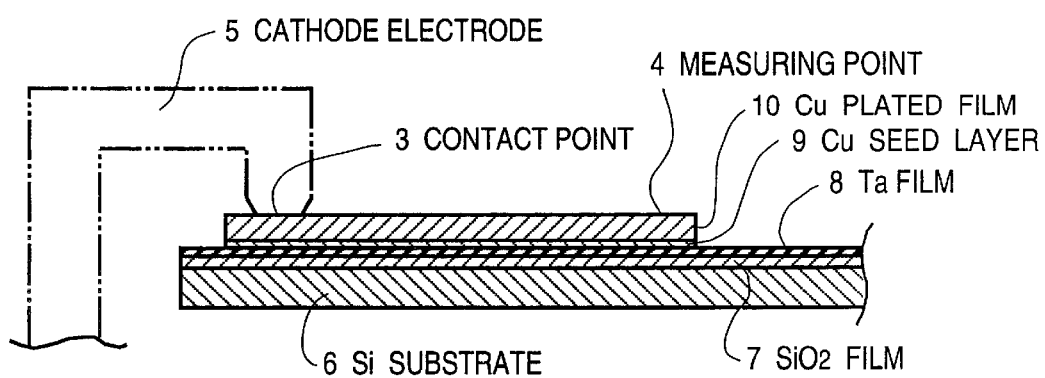
FIG. 4 is a diagrammatic sectional view taken along the line B—B in FIG. 3.

Referring to FIG. 3, there is shown a diagrammatic plan view of a testing wafer used in a second embodiment of the detector in accordance with the present invention. FIG. 4 is a diagrammatic sectional view taken along the line B—B in FIG. 3. In FIGS. 3 and 4, elements corresponding to those shown in FIGS. 1 and 2 are given the same reference numbers, and a detailed explanation thereof will be omitted for simplification of the description.

The shown testing wafer includes a silicon oxide film 7 coated on a circular silicon wafer or substrate 6, and a Ta film 8 is formed to cover the whole surface of the silicon oxide film 7. A number of Cu (copper) seed layer strips 9 having a length shorter than a radius of the circular silicon substrate 6 are formed on the whole surface of the Ta film 8 to extend radially inwardly from a peripheral edge of the circular silicon substrate and to be located with equal angular intervals, separately from each other. The Cu seed layer strips 9 have the same width, the same length and the same plan shape. A Cu electroplated film strip 10 is formed on each Cu seed layer strip 9. The Cu electroplated film strip 10 has the same plan shape as that of the Cu seed layer strip 9.

Similarly to the first embodiment, a contact point 3 is formed on a radially outward end of each Cu electroplated film strip 10, and a measuring point 4 is formed on a radially inward end of each Cu electroplated film strip 10, so that in a measuring operation, a cathode electrode 5 shown by a two-dot chain line in FIG. 4 is brought into contact with the contact point 3, as shown in FIG. 4, and a measuring probe (not shown in FIG. 4) is brought into contact with the measuring point 4. For simplification, only one cathode electrode 5 is shown in FIG. 4, but it is to be understood that a number of cathode electrodes are provided in the electroplating machine.

Now, a method for individually detecting a contact resistance anomaly of each cathode electrode in the electroplating machine having a plurality of cathode electrodes will be described.

The resistance value $R_1$ of each cathode electrode 5 is previously measured, and, the resistance value R2 between the contact point 3 and the measuring point 4 on each Cu electroplated film strip 10 is also previously measured before the testing wafer is set in the electroplating machine. Then, similarly to the first embodiment, the cathode electrodes provided in the electroplating machines are brought into contact with the contact point 3 of the electroplated film strips 10, respectively, and the minus terminal of the measuring circuit (not shown in FIG. 4) is electrically connected to all the cathode electrodes. The measuring probe (not shown in FIG. 4) is contacted to the measuring point 4 of all the Cu electroplated film strips 10, one after another, for obtaining a resistance value $R_3$ of a series circuit formed of the resistance $R_1$ of the cathode electrode, a contact resistance $R_4$ between the cathode electrode and the contact point 3 of the Cu electroplated film strip 10, and the resistance $R_2$ of the electroplated film strip 10. Thus, the contact resistance $R_4$ between the cathode electrode and the contact point 3 of each Cu electroplated film strips 10 can be obtained from $\{R_3-(R_1+R_2)\}$.

Accordingly, the contact resistance $R_4$ of all the cathode electrodes 5 at the respective contact points 3 can be known. The cathode electrode 5 showing an extremely high contact resistance can be deemed to be a cathode electrode presenting an inadequate or defective contact. Therefore, by adjusting the cathode electrode showing the high contact resistance, the contact resistance of all the cathode electrodes can be made uniform, when the cathode electrodes are actually brought into contact with a wafer to be electroplated in the electroplating machine, with the result that an in-plane distribution of the plated film thickness can be made uniform. Namely, it is possible to obtain the plated film having a film thickness uniform along a concentric circle.

As mentioned above, since an in-plane distribution of a plated film thickness on a wafer is substantially governed by a contact resistance between each of the cathode electrodes and a wafer to be electroplated, the cathode electrode presenting an inadequate or defective contact gives an adverse influence on controllability of the in-plane distribution of the plated film thickness on a wafer. Since a number of cathode electrodes are brought into contact with a periphery of a wafer to be electroplated, if the contact resistance of the cathode electrodes varies, the plated film thickness correspondingly greatly varies along a concentric circle on the wafer. In this embodiment, however, since the cathode electrode presenting the inadequate or defective contact can be detected, it is possible to elevate the controllability of the in-plane distribution of the plated film thickness on a wafer.

Next, a process for forming the testing wafer shown in FIGS. 3 and 4 will be described with respect to FIGS. 3 and 4. First, the silicon oxide film 7 is formed on the circular silicon substrate 6 by for example a CVD (chemical vapor deposition) process. On the whole surface of the silicon oxide film 7, the Ta film 8 and a Cu seed layer are deposited in the named order by sputtering. Then, by using the Cu seed layer as an underlying film, a Cu electroplated film is deposited by for example electroplating. Thereafter, a number of acid-resistant tapes are adhered on the Cu electroplated film to mask the Cu electroplated film. The acid-resistant tapes have the same shape as that of the Cu electroplated film strips 10 and are located at the same positions as those of the Cu electroplated film strips 10. Therefore, the number of the acid-resistant tapes is the same as that of the Cu electroplated film strips 10, namely, the number of the cathode electrodes provided in the electroplating machine, and all the acid-resistant tapes have the same shape. Then, the Cu electroplated film masked with the acid-resistant tapes and the underlying Cu seed layer are wet-etched with a Cu etchant, for example, ammonium persulfate or nitric acid. Thus, the Cu electroplated film strips 10 and the underlying Cu seed layer strips 9 are formed on the Ta film 8. Thereafter, the substrate 6 is sufficiently washed, and the acid-resistant tapes are removed. Thus, the testing wafer is prepared.

Figure 5:
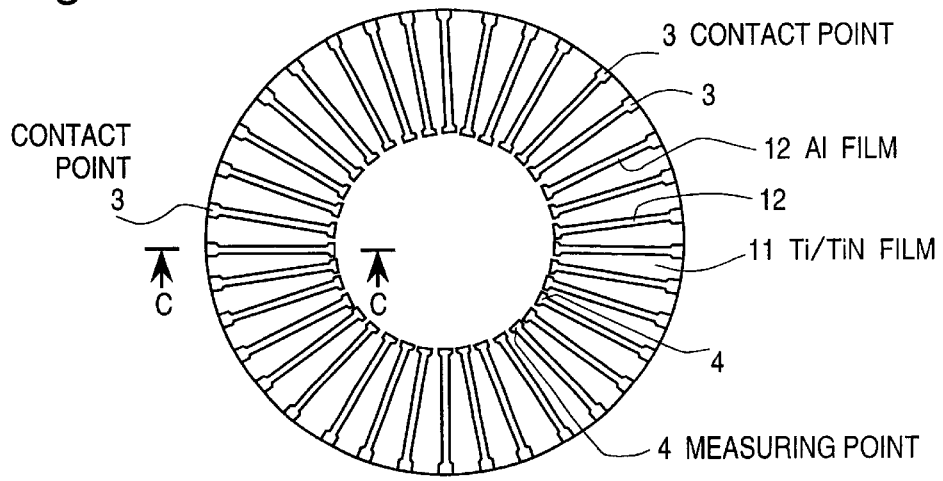
FIG. 5 is a diagrammatic plan view of a testing wafer used in a third embodiment of the detector in accordance with the present invention.
Figure 6:
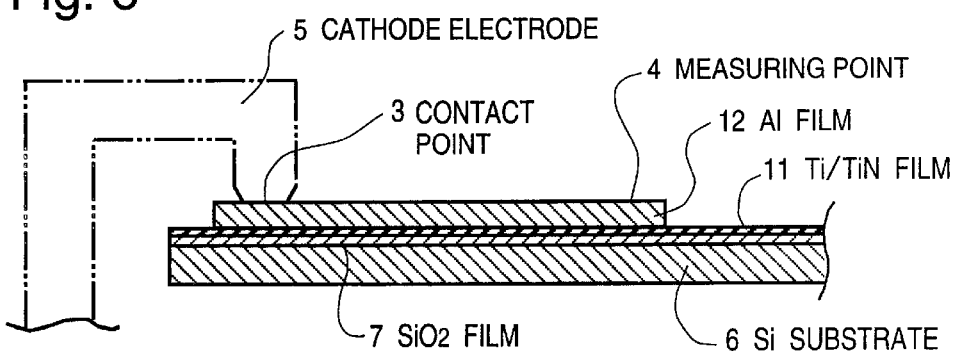
FIG. 6 is a diagrammatic sectional view taken along the line C—C in FIG. 5.

Referring to FIG. 5, there is shown a diagrammatic plan view of a testing wafer used in a third embodiment of the detector in accordance with the present invention. FIG. 6 is a diagrammatic sectional view taken along the line C—C in FIG. 5. In FIGS. 5 and 6, elements corresponding to those shown in FIGS. 3 and 4 are given the same reference numbers, and a detailed explanation thereof will be omitted for simplification of the description.

Since the third embodiment is different from the second embodiment only in that the Ta film 8 is replaced with a Ti/TiN film 11 (a laminated film of a Ti film and a TiN film), and the Cu seed layer strips 9 and the Cu plated film strips 10 are replaced with aluminum film strips 12, further explanation will be omitted. Therefore, the method for detecting the cathode electrode presenting an inadequate or defective contact is carried out similarly to that in the second embodiment.

Next, a process for forming the testing wafer shown in FIGS. 5 and 6 will be described with FIGS. 5 and 6. First, the silicon oxide film 7 is formed on the circular silicon substrate 6 by for example a CVD process. The Ti/TiN film 11 is deposited on the whole surface of the silicon oxide film 7, by a sputtering. Furthermore, an aluminum film is deposited on the whole surface of the Ti/TiN film 11, by a sputtering. On the whole surface of the aluminum film, a number of photoresist patterns are formed which have the same shape as that of the aluminum film strips 12 shown in FIG. 5 and are located at the same positions as those of the aluminum film strips 12 shown in FIG. 5. Therefore, the number of the photoresist patterns is the same as that of the aluminum film strips 12, namely, the number of the cathode electrodes provided in the electroplating machine, and all the photoresist patterns have the same shape. Then, the aluminum film masked with the photoresist patterns is dry-etched, so that the aluminum film strips 12 are formed on the Ti/TiN film 11. Thereafter, the photoresist patterns are removed by an organic remover or an ashing. Thus, the testing wafer is prepared.

In the above mentioned second and third embodiments, the intervening film is formed of the Ta film 8 or the Ti/TiN film 11, but can be formed of a TaN film. In the above mentioned second and third embodiments, the metal film strips are formed of a single metal layer of copper (Cu) or aluminum (Al), but can be formed of a single metal layer of tungsten (W), or a plurality of laminated metal layers of copper and aluminum (AlCu).

The invention has thus been shown and described with reference to the specific embodiments. However, it should be noted that the present invention is in no way limited to the details of the illustrated structures but changes and modifications may be made within the scope of the appended claims.

What is claimed is:

1. A detector for detecting a contact resistance anomaly, comprising:
   a plurality of cathode electrodes;
   a testing wafer having a plurality of metal films separately formed thereon, said plurality of cathode electrodes being individually simultaneously contactable with said plurality of metal films; and
   a measuring means for measuring a contact resistance between one of said plurality of cathode electrodes and a corresponding one of said plurality of metal films when said one of said plurality of cathode electrodes individually contacts said one of said plurality of metal films.

2. A detector claimed in claim 1 wherein each of said plurality of metal films includes a contact point to which a corresponding one of said plurality of cathode electrodes is brought into contact, and a measuring point to which one end of said measuring means is brought into contact, for measuring at said contact point the contact resistance of said corresponding one of said plurality of cathode electrodes.

3. A detector claimed in claim 1 wherein said testing wafer has at least one intervening film formed thereon, said plurality of metal films being formed on said at least one intervening film.

4. A detector claimed in claim 3 wherein said at least one intervening film is formed of a material selected from the group consisting of Ta, TaN, Ti and TiN.

5. A detector claimed in claim 1 wherein each of said metal films is formed of a single metal layer.

6. A detector claimed in claim 5 wherein each of said metal films is formed of a material selected from the group consisting of Cu, Al, AlCu and W.

7. A detector claimed in claim 1 wherein each of said metal films is formed of a plurality of laminated metal layers.

8. A detector claimed in claim 7 wherein each of said metal films is formed of a material selected from the group consisting of Cu, Al, AlCu and W.

9. A detector claimed in claim 1 wherein said testing wafer is formed of a silicon wafer.

10. A detector for detecting a contact resistance anomaly, comprising:
    a plurality of cathode electrodes of an electroplating machine;
    a circular silicon testing wafer having a plurality of metal film strips on one surface thereof, separate from each other, so that said plurality of cathode electrodes are simultaneously contactable with said plurality of metal film strips; and
    a measuring means for individually measuring a contact resistance between each of said plurality of cathode electrodes and a corresponding one of said plurality of metal film strips when said plurality of cathode electrodes are simultaneously brought into contact with said plurality of metal film strips.

11. A detector claimed in claim 10 wherein said metal film strips are located with equal angular intervals, separately from each other, on said circular silicon wafer, and said metal film strips extend radially inwardly from a peripheral edge of said circular silicon wafer and have the same width, the same length and the same plan shape, the length of said metal film strips being shorter than a radius of said circular silicon wafer, so that said circular silicon wafer has a center region in which no metal film strip is provided, and therefore, said metal film strips are never contacted with each other on said circular silicon wafer, and wherein each of said number of metal film strips has a radially outward end provided with a contact point to which a corresponding one of said number of cathode electrodes is brought into contact, and a radially inward end provided with a measuring point to which one end of said measuring means is brought into contact, for measuring at said contact point the contact resistance of said corresponding one of said number of cathode electrodes.

12. A detector claimed in claim 10 wherein said testing wafer has at least one intervening film formed thereon, said number of metal film strips being formed on said at least one intervening film.

13. A detector claimed in claim 12 wherein said at least one intervening film is formed of a material selected from the group consisting of Ta, TaN, Ti and TiN.

14. A detector claimed in claim 10 wherein each of said metal film strips is formed of a single metal layer.

15. A detector claimed in claim 14 wherein each of said metal film strips is formed of a material selected from the group consisting of Cu, Al, AlCu and W.

16. A detector claimed in claim 10 wherein each of said metal film strips is formed of a number of laminated metal layers.

17. A detector claimed in claim 16 wherein each of said metal film strips is formed of a material selected from the group consisting of Cu, Al, AlCu and W.

18. A method for detecting a contact resistance anomaly in a plurality of cathode electrodes of an electroplating machine comprising the steps of:

forming a plurality of separate metal film strips on one surface of a circular silicon testing wafer;

placing said testing wafer in said electroplating machine and simultaneously contacting said plurality of cathode electrodes with said plurality of metal film strips; and individually measuring a contact resistance between each of said plurality of cathode electrodes and a corresponding one of said plurality of metal film strips.

19. A detector claimed in claim 18 wherein said metal film strips are located with equal angular intervals, separately from each other, on said circular silicon wafer, and said metal film strips extend radially inwardly from a peripheral edge of said circular silicon wafer and have the same width, the same length and the same plan shape, the length of said metal film strips being shorter than a radius of said circular silicon wafer, so that said circular silicon wafer has a center region in which no metal film strip is provided, and therefore, said metal film strips are never contacted with each other on said circular silicon wafer, each of said number of metal film strips having a contact point provided at a radially outward end thereof and a measuring point provided at a radially inward end thereof, wherein said individual measuring of the contact resistance is carried out by simultaneously bringing said number of cathode electrodes into contact with said contact point of said number of metal film strips, respectively, and individually bringing one end of said measuring means into contact with said measuring point of said number of metal film strips, one after another, for measuring a resistance between each of said number of cathode electrodes and said measuring point of a corresponding one of said number of metal film strips, so as to derive the contact resistance at said contact point between each of said number of cathode electrodes and said corresponding one of said number of metal film strips.

\* \* \* \* \*